(12) United States Patent
Jagmohan et al.

(10) Patent No.: US 8,990,217 B2
(45) Date of Patent: Mar. 24, 2015

(54) LOSSLESS COMPRESSION OF HIGH NOMINAL-RANGE DATA

(75) Inventors: Ashish Jagmohan, Irvington, NY (US); Joshua W. Knight, Mohegan Lake, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 13/181,880

(22) Filed: Jul. 13, 2011

(65) Prior Publication Data

US 2013/0018889 A1 Jan. 17, 2013

(51) Int. Cl.
*G06F 17/30* (2006.01)
*H03M 7/30* (2006.01)

(52) U.S. Cl.
CPC ....... *H03M 7/3084* (2013.01); *G06F 17/30613* (2013.01); *G06F 2212/401* (2013.01)
USPC .............. 707/741; 707/693; 707/746; 367/14

(58) Field of Classification Search
CPC ........... G01V 1/22; G01V 1/223; G01V 1/30; G06F 17/30241; G06F 12/08; G06F 2212/1044; G06F 2212/401; H03M 7/24; H03M 7/30; H04L 67/12; H04L 69/04; H04N 19/00939; H04N 19/00981; H04N 7/26085
USPC ......... 707/741, 723, 736, 748, 751, 754, 758, 707/790, 804, 830, 1, 104, 693; 702/14, 17; 367/14, 21
See application file for complete search history.

(56) References Cited

U.S. PATENT DOCUMENTS

| 5,933,790 | A | 8/1999 | Jeffryes |
| 6,061,299 | A | 5/2000 | Grouffal et al. |
| 6,125,348 | A | 9/2000 | Levine |
| 6,309,424 | B1 | 10/2001 | Fallon |
| 6,362,757 | B1 | 3/2002 | Lee et al. |
| 6,594,394 | B1 * | 7/2003 | Stromberg et al. ........... 382/232 |
| 6,826,227 | B1 * | 11/2004 | Duval et al. .................. 375/240 |
| 7,051,035 | B2 * | 5/2006 | Meek ............................ 707/812 |
| 7,265,692 | B2 * | 9/2007 | Martin et al. ................. 341/107 |
| 7,274,671 | B2 | 9/2007 | Hu |

(Continued)

OTHER PUBLICATIONS

Giovanni Manzini et al.; "An Analysis of the Burrows-Wheeler Transform"; Journal of the Association for Computing Machinery, vol. 48, No. 3, May 2001; pp. 407-430.

(Continued)

*Primary Examiner* — Jay Morrison
*Assistant Examiner* — Dangelino Gortayo
(74) *Attorney, Agent, or Firm* — Cantor Colburn LLP

(57) ABSTRACT

A method for receiving a data stream that includes data samples, each data sample having one of a plurality of actual values. For each data sample in the data stream, a first index in a dictionary is selected. The dictionary includes indices corresponding to each of the plurality of actual values. The first index corresponds to an actual value of the data sample. A predicted value of the data sample is generated in response to previously received data samples in the data stream and to a prediction algorithm. A second index in the dictionary that corresponds to an actual value in the dictionary that is closest to the value of the predicted value is selected. The difference between the first index and the second index is calculated and compressed. The compressed difference between the first index and the second index is then output. This process is performed for each data sample in the data stream.

24 Claims, 5 Drawing Sheets

(56) References Cited

U.S. PATENT DOCUMENTS

| | | | |
|---|---|---|---|
| 7,447,814 B1 | 11/2008 | Ekman | |
| 7,586,424 B2 | 9/2009 | Monro | |
| 7,705,753 B2* | 4/2010 | Speirs et al. | 341/50 |
| 7,845,571 B2 | 12/2010 | Monro | |
| 7,864,083 B2* | 1/2011 | Mahoney | 341/87 |
| 7,974,478 B2* | 7/2011 | Bashyam et al. | 382/232 |
| 8,473,428 B2* | 6/2013 | Li et al. | 706/12 |
| 2005/0071562 A1 | 3/2005 | Adl-Tabatabai et al. | |
| 2005/0193022 A1* | 9/2005 | Rigerts et al. | 707/200 |
| 2006/0184488 A1* | 8/2006 | Wentland | 706/45 |
| 2006/0284747 A1 | 12/2006 | Moriya | |
| 2009/0260883 A1* | 10/2009 | Suarez-Rivera et al. | 175/58 |
| 2010/0223237 A1 | 9/2010 | Mishra et al. | |
| 2011/0066411 A1* | 3/2011 | Morio et al. | 703/2 |
| 2011/0298610 A1* | 12/2011 | Etkin et al. | 340/539.3 |
| 2012/0253762 A1* | 10/2012 | Ergas et al. | 703/6 |

OTHER PUBLICATIONS

Guan et al.; "Compression of Arbitrary Cutting Planes"; Conference "Proceedings of Conference on Data Cmpression" (DCC '99); 1999; Publisher: IEEE Computer Society; Los Alamitos, CA; ISBN No. 0-7695-0096-X; Database: INSPEC.

Kaplan; "A Simpler Analysis of Burrows-Wheeler Based Compression"; School of Computer Science, vol. 387; No. 3; pp. 220-235; 2007; Publisher: Elsevier Science B.V.; Country of Publication; Netherlands; ISSN: 0304-3975; Database: INSPEC.

Ratanaworabhan et al.; "Fast Lossess Compression of Scientific Floating-Point Data"; Conference—Proceedings, DCC 2006; Data Compression Conference 2006; IEEE Computer Society; Los Alamitos, CA; ISBN No. 0-7695-2545-8; Database INSPEC.

* cited by examiner

LOSSLESS COMPRESSION OF HIGH NOMINAL-RANGE DATA

BACKGROUND

The present invention relates generally to computers, and more specifically to lossless compression of data with high nominal ranges.

One example of high nominal-range data is floating-point data. An example of floating-point data that benefits from data compression is seismic data. Seismic processing involves the acquisition and analysis of fields of subsurface data, acquired through reflective seismic waves. With improvements in acquisition modalities, the amount of data to be stored and processed is increasing at a rapid rate. An example data field may be terabytes in size and may need to be stored for several months for analysis. The large size of such fields imply a large cost for transmission and storage, as well as computational costs during analysis since the data has to be moved to and from computational cores. Compression of seismic data can mitigate these costs, and the ability to achieve a high level of compression is of great interest in this area. Seismic data tends to be floating-point data, and is typically required to be compressed using lossless compression techniques so that information that may be of use during analysis is not discarded during compression.

SUMMARY

An embodiment is a method for receiving a data stream that includes data samples, each data sample having one of a plurality of actual values. For each data sample in the data stream, a first index in a dictionary is selected. The dictionary includes indices corresponding to each of the plurality of actual values. The first index corresponds to an actual value of the data sample. A predicted value of the data sample is generated in response to previously received data samples in the data stream and to a prediction algorithm. A second index in the dictionary that corresponds to an actual value in the dictionary that is closest to the value of the predicted value is selected. The difference between the first index and the second index is calculated and compressed. The compressed difference between the first index and the second index is then output. This process is performed for each data sample in the data stream.

Another embodiment is a system that includes an encoder configured for receiving a data stream that includes data samples, each data sample having one of a plurality of actual values. For each data sample in the data stream, a first index in a dictionary is selected. The dictionary includes indices corresponding to each of the plurality of actual values. The first index corresponds to an actual value of the data sample. A predicted value of the data sample is generated in response to previously received data samples in the data stream and to a prediction algorithm. A second index in the dictionary that corresponds to an actual value in the dictionary that is closest to the value of the predicted value is selected. The difference between the first index and the second index is calculated and compressed. The compressed difference between the first index and the second index is then output. This process is performed for each data sample in the data stream.

Another embodiment is a method that includes receiving a data stream that includes a plurality of compressed index difference values representing a plurality of data samples. For each compressed index difference value received in the data stream, the compressed index difference value is decompressed resulting in an index difference value. A predicted value of a data sample is generated in response to previously received compressed index difference values and to a prediction algorithm. A second index is selected in a dictionary that includes indices corresponding to each of a plurality of actual values of data samples. The second index corresponds to an actual value in the dictionary that is closest to the predicted data value of the data sample. A first index in the dictionary corresponding to an actual value of a data sample represented by the received compressed index difference value is identified in response to the second index, the index difference value, and the dictionary. The actual value of the data sample is output.

A further embodiment is a system that includes a decoder configured for receiving a data stream that includes a plurality of compressed index difference values representing a plurality of data samples. For each compressed index difference value received in the data stream, the compressed index difference value is decompressed resulting in an index difference value. A predicted value of a data sample is generated in response to previously received compressed index difference values and to a prediction algorithm. A second index is selected in a dictionary that includes indices corresponding to each of a plurality of actual values of data samples. The second index corresponds to an actual value in the dictionary that is closest to the predicted data value of the data sample. A first index in the dictionary corresponding to an actual value of a data sample represented by the received compressed index difference value is identified in response to the second index, the index difference value, and the dictionary. The actual value of the data sample is output.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

An embodiment of the present invention provides lossless compression of data that is characterized by a high nominal range and a limited number of unique values. Certain seismic datasets are examples of such data. Embodiments described herein leverage the limited number of unique values of the data in order to achieve efficient compression. A dictionary with one entry for each of the different possible actual values of the data samples is constructed and used in conjunction with predictive coding tailored to features of the data. The predictor is computed over the data values, which is more efficient than computing the predictor over the dictionary indices because the dictionary indices are likely to have a correlation structure that is harder to compute and, hence, leverage for compression. This computed predictor, which in general takes values on a larger set (up to the nominal range of the data), is quantized on to the aforementioned dictionary, and the difference between the quantized predictor and the dictionary index value corresponding to the actual data sample (i.e., the actual data sample quantized to the dictionary) is further compressed using a lossless compression algorithm (also termed an entropy coding algorithm) which may be universal or tuned specifically to the data-set.

Because of the large volume of data associated with seismic data, an effective compression algorithm should be able to losslessly compress floating-point seismic data by a significant factor. A key attribute that certain types of seismic data may have is that, even though the seismic data is floating-point with a nominal range of 32 bits, the number of unique floating-point values that occurs in the data may be much smaller than $2^{32}$. This may be a result, for example, of the limited range of the analog to digital (A/D) converter that digitizes the data in the process of acquisition, or it may be the result of data pre-processing.

An embodiment allows the use of prediction algorithms tailored to the features of the data, while at the same time leveraging the limited number of unique values that the data can take. Thus it can be used to achieve higher rates of compression than other approaches outlined below in reference to FIG. 3. Further, the proposed technique is useful for compression of any data (i.e. even non-seismic data) that has the characteristics that it nominally lies in a large-alphabet domain and data values have significant correlation in this domain, but the data field takes unique values over a smaller subset of the domain.

Figure 1:
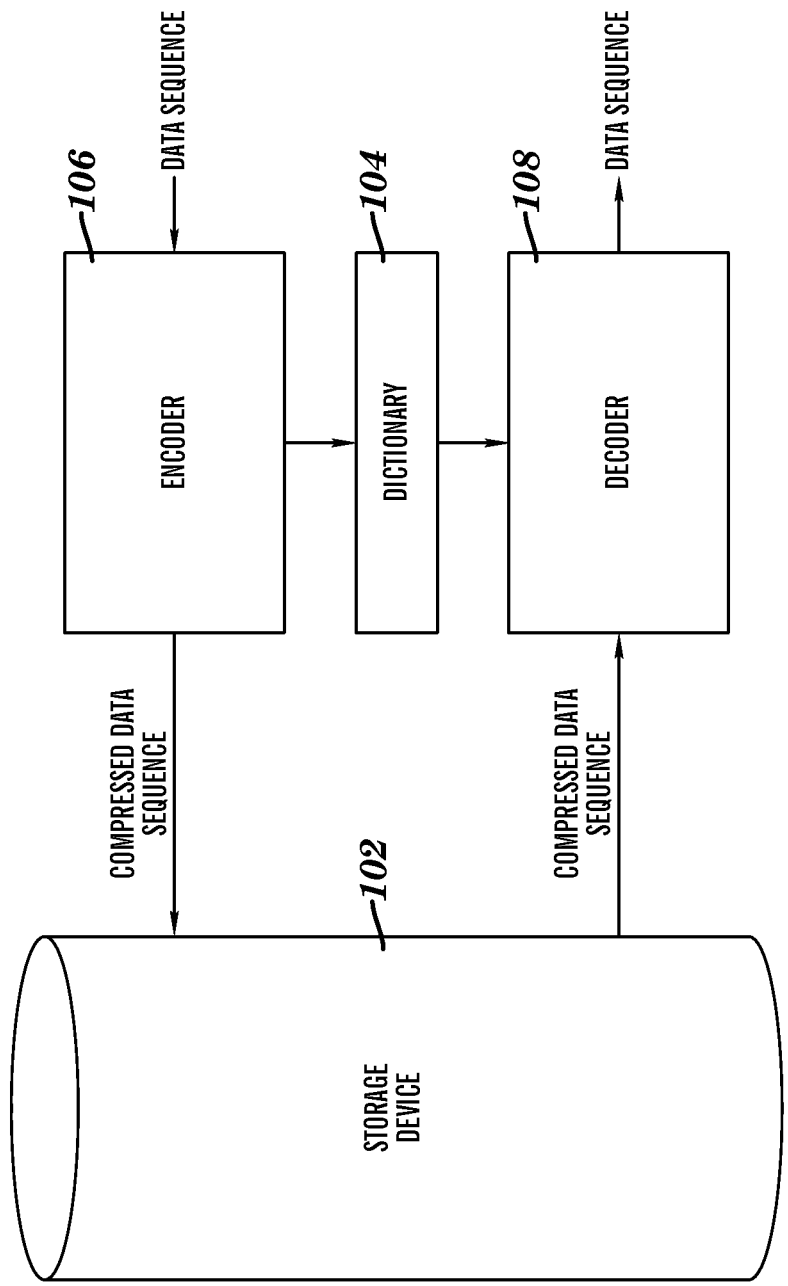
FIG. 1 illustrates a block diagram of a system for encoding and decoding data in a memory system in accordance with an embodiment.

FIG. 1 illustrates a block diagram of a system for encoding and decoding data in a memory system in accordance with an embodiment. The system depicted in FIG. 1 includes a storage device 102 which may be implemented by memory internal to a processor such as main memory or cache, by a stand-alone storage device such as a hard disk drive (HDD), or by any other type of storage medium. FIG. 1 also includes an encoder 106 for receiving and encoding a data sequence (also referred to herein as a "data stream"), for generating a dictionary 104 from the data sequence, and outputting a compressed data sequence for storage in the storage device 102. The system in FIG. 1 also includes a decoder 108 for receiving the compressed data sequence from the storage device 102 and the dictionary 104 created by the encoder 106. The decoder 108 generates the data sequence from the compressed data sequence.

The dictionary 104 is built over the data sequence prior to encoding/compressing the data sequence. In an embodiment, the dictionary 104 is built for a subsequence of the data and used for the encoding/decoding of the subsequence, and multiple dictionaries may be built, one for each sub-sequence. In one embodiment, the encoder 106, decoder 108, and dictionary 104 (or multiple dictionaries) are located on a memory controller or memory module. In an alternate embodiment, the encoder 106, decoder 108, and dictionary (or multiple dictionaries) 104 are located on a memory device. The dictionary (or dictionaries) 104 may be stored in any storage location that is accessible by both the encoder 106 and the decoder 108. In another embodiment, there are two copies of each dictionary, one accessible by the encoder 106 and the other accessible by the decoder 108. In another embodiment, the encoder compresses each dictionary and the compressed dictionaries are included in the compressed sequence. In this embodiment, the decoder gains access to the dictionaries by decompressing them from the compressed sequence.

Figure 2:
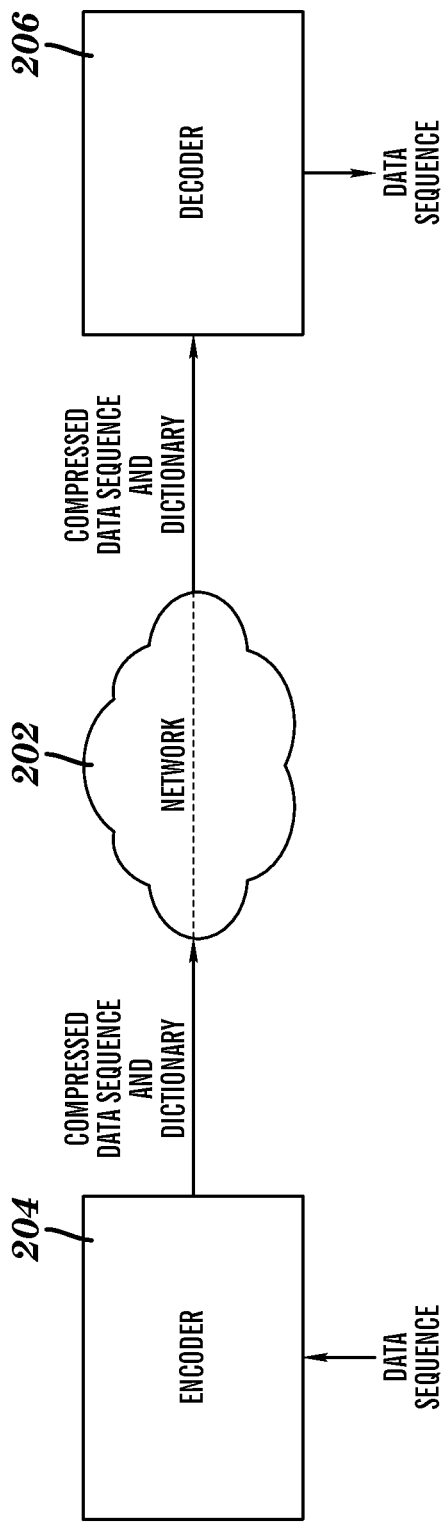
FIG. 2 illustrates a block diagram of a system for encoding and decoding data for transmission across a network in accordance with an embodiment.

FIG. 2 illustrates a block diagram of a system for encoding and decoding data for transmission across a network (or other transmission medium) in accordance with an embodiment. FIG. 2 includes an encoder 204 for compressing a data sequence, a network 202 for transmitting the compressed data, and a decoder 206 for generating the data sequence from the compressed data. The network 202 shown in FIG. 2, may be implemented by any type of network known in the art, such as but not limited to a wired network, a wireless network, a cellular network, an intranet, the Internet, a local area network (LAN), and a wide area network (WAN). In an embodiment the network 202 is a bus or other transmission medium that directly connects the encoder 204 to the decoder 206. In an embodiment, the dictionary (or multiple dictionaries) are compressed and transmitted across the network 202 along with the compressed data.

In an embodiment, the encoding/compression algorithms used for a communication system, such as that shown in FIG. 2, are the same algorithms as those used in a storage system, such as that shown in FIG. 1. In another embodiment, the different constraints in different types of systems are taken into account and the encoding/compression algorithms are different.

Figure 3:
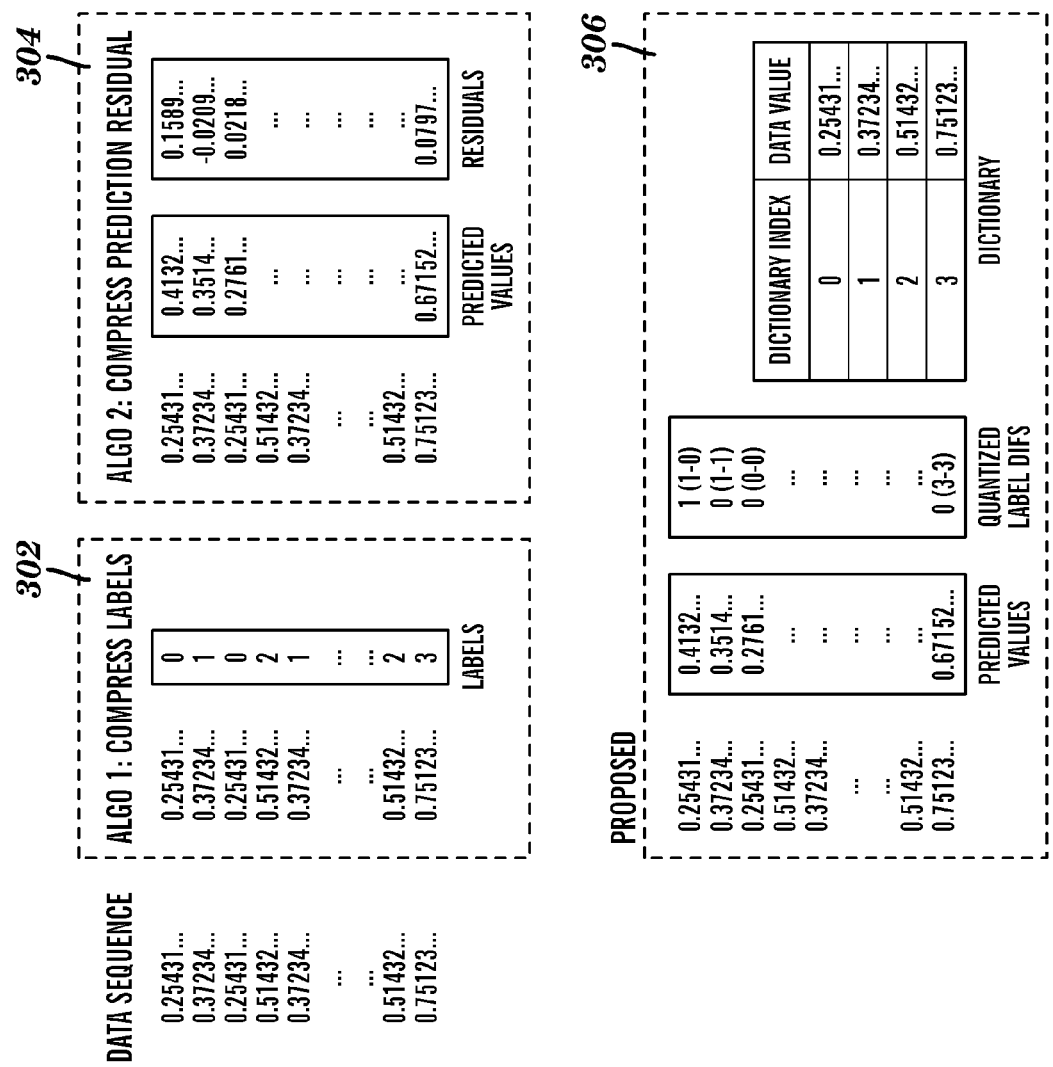
FIG. 3 illustrates three different algorithms for compressing seismic data.

FIG. 3 illustrates three different algorithms for compressing high nominal-range data that has a limited number of unique values. All three examples use the same floating-point data sequence and assume that the floating-point data sequence has high precision (many more digits of precision than the five digits pictured) and can take on values between zero and one. In these examples, the data sequence takes on four unique values (0.25431 . . . , 0.37234 . . . , 0.51432 . . . , and 0.73123 . . . ). Thus, the data sequence has a large nominal range, but the actual data points take only a subset of the possible values. It is also assumed that the data is correlated, i.e. the value of a next data point can be estimated with some accuracy based on the values of some number of past data points.

Algorithm one 302 is an example of replacement of the data values with labels in a dictionary of unique actual values, which can then be further compressed by a lossless compression algorithm, such as those based on Lempel-Ziv coding (and its variants) as well as those based on universal arithmetic coding and variants. The chief shortcoming of this approach is that transformation of the original data to the label data makes the correlation structure of the data harder to exploit, since computing the correlation structure of the labels is generally harder than computing the correlation structure of the original data. Thus such an approach yields sub-optimal compression.

Algorithm two 304 in FIG. 3 is an example of a prediction based algorithm that is aware of the nature of the data and seeks to exploit the correlations that are expected in the uncompressed data. A chief shortcoming of this type of algorithm is that the generated predictor values tend to lie in a much larger set than the unique values of the seismic data. Thus, trying to compress, for example, the residual (Hamming distance, Euclidean difference, etc.) between the predictor and data samples is not very efficient, since this residual will be high precision and take on values on a large set making it harder to compress efficiently. As shown in algorithm two 304 in FIG. 3, the residual values are high precision and take on a large number of possible values. Thus it is difficult to effectively compress the residual values.

Algorithm three 306 in FIG. 3 depicts a compression algorithm that is implemented by an exemplary embodiment. Algorithm three 306 exploits the correlation in the data and creates a highly compressed data sequence. First, a dictionary containing all of the unique actual data point values in a data sequence is generated. In an embodiment, the dictionary stores each of the unique data point values in numerical order, and each data point has an index value (e.g., 0, 1, 2, up to the number of entries in the dictionary). As shown in algorithm three 306 of FIG. 3, the data point value 0.25431 . . . has an index value of 0, 0.37234 . . . has an index of 1, 0.51432 . . . has an index value of 2, and 0.73123 . . . has an index value of 3.

In an embodiment, finding the index value in the dictionary associated with a data point is referred to as quantizing the data point to the dictionary. As known in the art, quantizing refers to the process of constraining something from a relatively large or continuous set of values (such as the actual data points or the predicted data points which both take on floating-point values) to a relatively small discrete set (such as the index in the dictionary).

For each data point in the data sequence, a data point prediction algorithm is executed based on one or more of the previous data points. Any prediction algorithm known in the art may be used to perform the prediction. Examples include linear and non-linear predictive algorithms with appropriately selected predictive-neighborhoods. The predicted value of the data point is quantized based on the index of the data point in the dictionary having a value that is closest to the predicted value of the data point (i.e., the predicted data point index). Here the "closest" point implies the point that minimizes an appropriate distance metric, such as absolute difference for example. As shown in algorithm three 306 of FIG. 3, the predicted value 0.4132 . . . is quantized as 1 because, among the data points in the dictionary, 0.4132 . . . is closest to the data point 0.37234 . . . in the dictionary and the data point 0.37234 . . . has a index value of 1. Similarly, as shown in FIG. 3, the predicted value 0.3514 . . . is quantized to 1, the predicted value 0.2761 . . . is quantized to zero and the predicted value 0.67152 . . . is quantized to 3.

Next, the dictionary index value of the actual value of the data point is determined. Thus, a data point value of 0.25431 . . . is quantized to 0, 0.37234 . . . is quantized to 1, 0.51432 . . . is quantized to 2, and 0.73123 . . . is quantized to 3.

As shown in algorithm three 306 of FIG. 3, the difference between the quantized value of the actual data point and the quantized value of the predicted data point is calculated. As shown in algorithm three 306 of FIG. 3, the data point value of 0.25431 . . . has a quantize value of 0 and the predicted value for that data point had a quantized value of 0.4132 . . . that was quantized to 1. Thus, the quantized label difference for the first data point in algorithm three 306 of FIG. 3 is 1. The rest of quantized label differences are calculated in a similar manner. In an embodiment, the quantized label differences are then compressed and output from the encoder as a compressed data sequence along with the dictionary.

Algorithm three 306 of FIG. 3 exploits the correlation between the data (by using a prediction algorithm), and ensures that the generated sequence (the quantized label differences) can be effectively compressed. This is because, if the accuracy of the predictor is good, the size of the quantized label differences will be a small value, and further the cardinality of the set of possible index difference remains small.

The example in FIG. 3 uses just four unique values for description purposes only. As an example, a typical raw seismic data sequence may include single precision floating-point numbers having a data domain of $2^{32}$ possible values. The number of unique floating-point values may be only $2^{17}$ to $2^{18}$ due to, for example, the limited range of an analog to digital converter, which digitizes data during acquisition, or due to data pre-processing which reduces the number of unique values.

Figure 4:
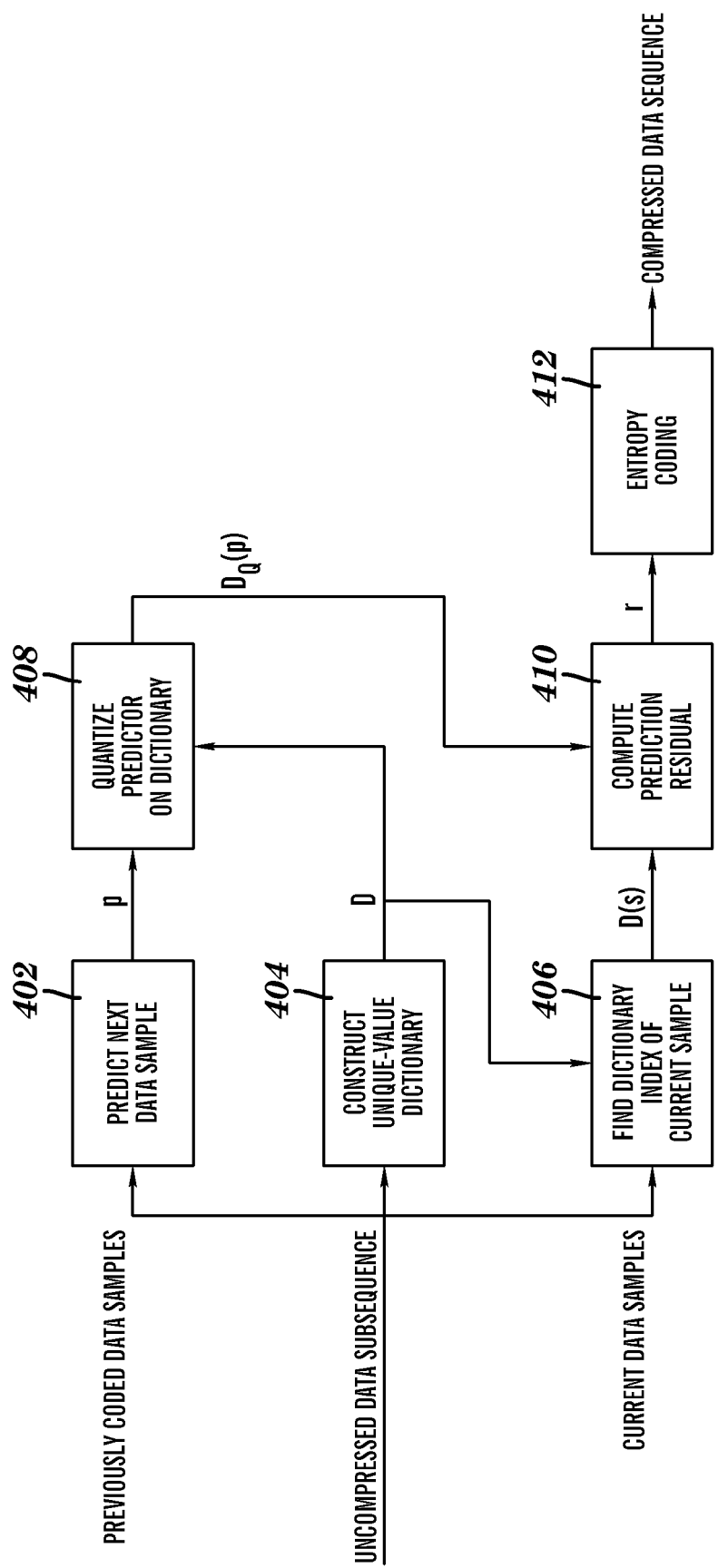
FIG. 4 illustrates a block diagram of an encoder for encoding and compressing data in accordance with an embodiment.

FIG. 4 illustrates a block diagram of an encoder, such as encoder 106 or encoder 204, for encoding and compressing data in accordance with an embodiment. At block 404, a sequence of the uncompressed data is parsed, in order to construct a dictionary, D, of all unique values that occur in the sequence. Each unique data point in the dictionary has an index value. In an embodiment, the data is partitioned into multiple subsequences, each subsequence consisting, for example, of a contiguous set of symbols. In this case, each subsequence may be compressed as a unit, independently of other subsequences, with a different dictionary being constructed for each subsequence. In another embodiment, a dictionary from a previous subsequence or sequence is used to compress the current data sequence/subsequence, and any data values not in the dictionary may be adaptively added to the dictionary (and this information may be included in the compressed data sequence). In an embodiment, the dictionary contains sorted values, in order to improve the efficacy of the compression algorithm (by reducing the magnitude of index differences), computational efficiency of computations involving dictionary searches, as well as to allow efficient compression of the dictionary.

In order to compress a data sample from the sequence the following steps are taken. First, at block 402, a predictor, p, is formed (e.g., a predicted data point is generated for the current sample) based on previously coded sequence data. In an exemplary embodiment for seismic data, a predictor for a sample belonging to a given seismic trace is constructed by means of a one dimensional minimum-mean-square-error (1D MMSE) linear filter that acts upon previously coded spatially neighboring elements in the same trace. In an embodiment, the weights of the filter are obtained by a-priori training over the seismic data sequence. A different filter may be trained for each trace that lies in the seismic data sequence being compressed. In another embodiment, the predictor is a two dimensional (2D) predictor acting upon the spatially neighboring samples in a 2D neighborhood. In a further embodiment, the filter is a three dimensional (3D) filter that acts upon the spatially neighboring samples in a 2D neighborhood, as well as neighboring samples from other shots. In other embodiments the filter is an adaptive filter whose coefficients change in response to the prediction residual at each coded sample. Other prediction filters and models known in the art (such as auto regressive moving average or ARMA, auto regressive integrated moving average or ARIMA, etc.) may also be used for the purpose of prediction.

Referring to block 408 of FIG. 4, the predicted value p is quantized on the dictionary, D. This involves finding the closest value in D to the predicted value p, where closeness is defined in exemplary embodiments in terms of an appropriate distance metric such as, but not limited to: Hamming or Euclidean distance. The quantized predictor value is denoted as $D_Q(p)$ in FIG. 4. Similarly, at block 406, the current data sample, s, is used to find the dictionary index corresponding to s, denoted D(s). The prediction residual, r, is then computed at block 410 from D(s) and $D_Q(p)$ by using an appropriate difference function such as the simple 1D Euclidean difference $r=D(s)-D_Q(p)$. At block 412, the resultant residual, r, is input to an entropy-coding engine, which produces the compressed data sequence including the compressed index differences. In an embodiment, the entropy coding engine is based on one or more of arithmetic coding, Lempel-Ziv coding, Huffman coding, etc. In an embodiment, the entropy-coding module is data aware, meaning that it is tuned to efficiently compress the prediction residuals arising from the described process. In an embodiment, the dictionary is also compressed and sent to the same location as the compressed data sequence. The dictionary can be compressed using any compression algorithm known in the art. In an embodiment, the dictionary, containing sorted values, is compressed using differential coding followed by lossless entropy coding. In an embodiment, a meta-data value indicating the prediction algorithm used is also output and sent to the same location as the compressed data sequence.

In an embodiment, the predictor is generated through lossy compression. The data to be compressed is input to a forward transform means that is implemented by a discrete cosine transform (DCT), a wavelet transform, a curvelet transform, or other transform of appropriate dimensionality. In an exemplary embodiment, the data to be compressed is seismic data and the transforms are 2D transforms applied individually to each shot, or 3D transforms applied to multiple shots, The transform coefficients are quantized lossily, meaning that information may be lost during the quantization. The quantized coefficients are then coded through the use of an entropy-coding engine. The output of the entropy-coding engine forms a compressed subsequence, which is included as a part of the complete compressed sequence. The quantized coefficients are then reconstructed by the means of inverse quantization and inverse transform coding. The reconstructed data at each sample location forms the predictor for that sample, which is used to losslessly compress the data as in FIG. 4.

Those skilled in the art will appreciate that a decoder using the same predictive algorithm as the encoder, along with the dictionary and the compressed data sequence will be able to generate the original data sequence. In an embodiment, the decoder receives a compressed data stream that includes the compressed index difference values. For each compressed index difference value, the decoder decompresses the compressed index difference value resulting in the index difference value ("r" in FIG. 4). A predicted data point ("p" in FIG. 4) is generated based on previously received data points (which have already been decompressed based on previously received compressed index difference values and the prediction algorithm used by the encoder). The predicted data point is quantized over a dictionary ("D" in FIG. 4)(the same dictionary used by the encoder) by selecting an index in the dictionary that is closest to the predicted data point. The result of the quantizing is an index value into the dictionary ("$D_Q(p)$" in FIG. 4). The data point ("s" in FIG. 4) is then reconstructed based on the index difference ("r" in FIG. 4), the index value of the predicted point ("$D_Q(p)$" in FIG. 4) and the dictionary, In an embodiment, the data point is identified by adding the index difference value "r" to the index value of the predicted point $D_Q(p)$ resulting in the index value of the data point ("D(s)" in FIG. 4). The original data point ("s" in FIG. 4) is the data point in the dictionary at this index value. The data point is then output as the uncompressed data sample.

Figure 5:
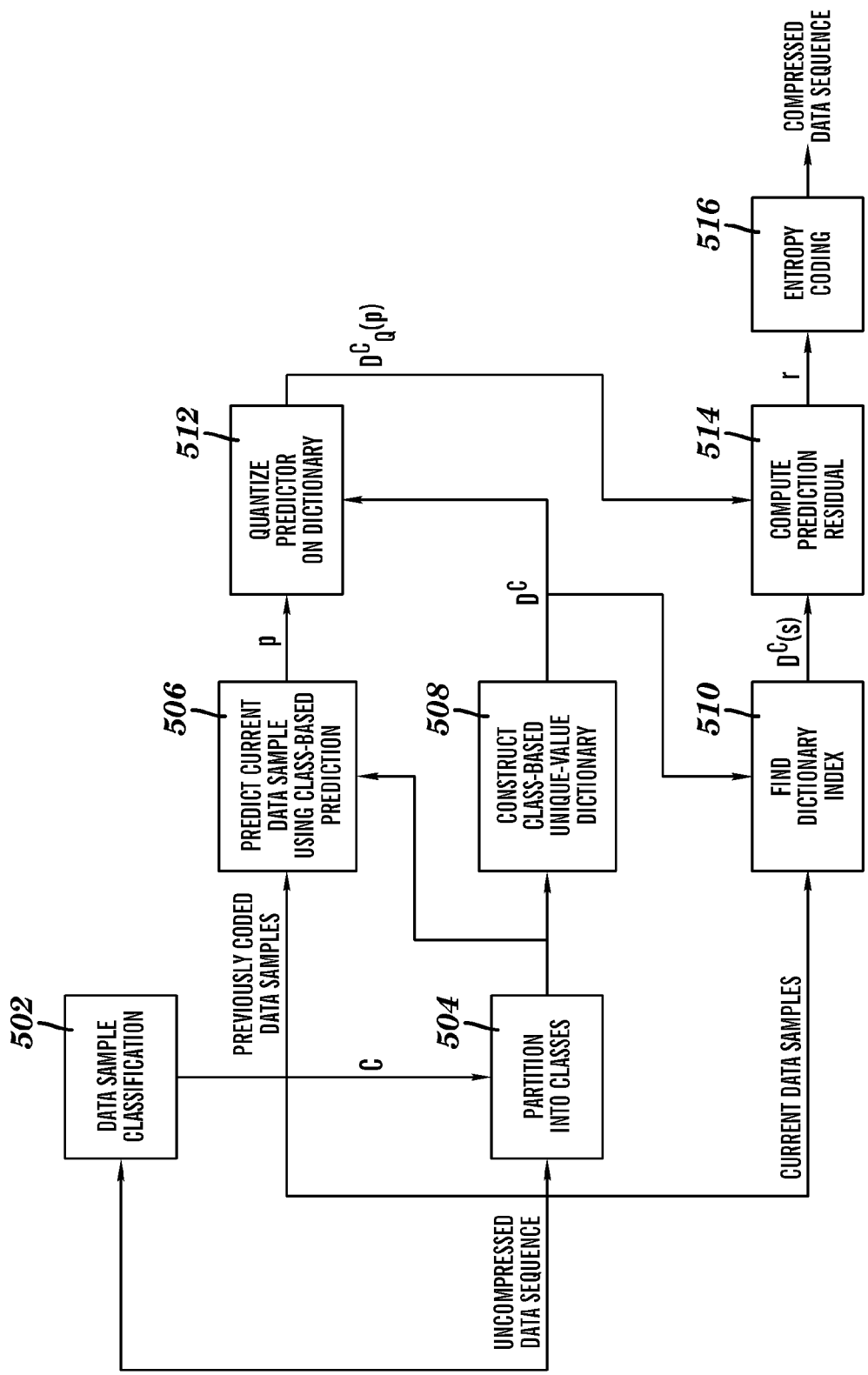
FIG. 5 illustrates a block diagram of an encoder for classifying, encoding, and compressing data in accordance with an embodiment.

FIG. 5 illustrates a block diagram of an encoder for performing classification-based lossless data compression in accordance with an embodiment. Depending on characteristics of the data, the embodiment of the encoder depicted in FIG. 5 may achieve higher compression than the embodiment of the encoder depicted in FIG. 4. A classification consisting of a set of classes, C, and a membership function mapping each sample to a class (explicitly or functionally) is generated from the data. The function mapping is performed at block 502 based on the data sequence being compressed. Each sequence to be compressed is partitioned on the basis of this classification at block 504. In an embodiment, the data to be compressed is seismic data, and the classification is on the basis of spatial regions in a raw seismic data shot. A seismic shot may include a parabolic wave-front region, as well as other background regions; this distinction can be used for the classification. In another embodiment, the data is floating-point data, and each floating-point sample is classified based on its exponent value, such that a class is made up of all samples with a common (or a common set) of exponent values. In an embodiment, a different dictionary is used for each type of data.

The sequence to be compressed is partitioned into such classes at block 504. At block 508, the samples belonging to each class are parsed, in order to construct a class-based dictionary $D^C$ of all unique values that occur in the samples belonging to that class.

In order to compress a data sample from the sequence the following steps are taken. At block 506, a predictor, p, is formed (e.g., a predicted data point is generated) based on previously coded sequence data in any of the manner described in reference to block 402 in FIG. 4. In an embodiment, both the prediction algorithm and the previous samples used to form the predictor value may be based on the class of the current data sample. At block 512, the predicted value, p, is quantized on the class-dictionary, $D^C$. This involves finding the closest value in $D^C$ to the predicted value p, where closeness is defined in exemplary embodiments in terms of an appropriate distance metric such as Hamming or Euclidean distance. The quantized predictor value is denoted as $D^C_Q(p)$ n FIG. 5. Similarly, at block 510, the current data sample, s, is used to find the dictionary index corresponding to s, denoted $D^C(s)$. The prediction residual, r, is then computed at block 514 from $D^C(s)$ and $D^C_Q(p)$ by using an appropriate difference function. At block 516, the resultant residual, r, is input to an entropy-coding engine, which produces the compressed data sequence. In an embodiment, the entropy coding engine is based on one or more of arithmetic coding, Lempel-Ziv coding, Huffman coding, etc. In an embodiment, the entropy-coding module is data-aware, meaning that it is tuned to efficiently compress the prediction residuals arising from the described process. In an embodiment, each class-dictionary is also compressed and sent to the same location as the compressed data sequence. The dictionary can be compressed using any compression algorithm known in the art. In an embodiment each dictionary, consisting of sorted values, is compressed using differential coding followed by lossless entropy coding.

In an exemplary embodiment, a new dictionary may not be generated for each sequence (or sub-sequence) of data. Instead, a dictionary built on past data may be utilized. In this case the dictionary is updated if a new value not in the dictionary is encountered, and information on these updates are included in the compressed stream. This can cut down on processing time and is advantageous when the number of unique data values exhibited by the data is stable over time.

Technical effects and benefits include the ability to leverage the correlated nature of a high nominal-range (e.g. floating-point) data stream characterized by a limited number of unique values to generate a highly compressed data sequence for transmission and/or storage.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method comprising:
receiving a data stream comprising data samples, each of the data samples having one of a plurality of actual values;
classifying the data stream into a plurality of different classes; and
performing for each of the data samples:
selecting a first index in a dictionary, the dictionary comprising indices corresponding to each of the plurality of actual values in a sorted order of the actual values, the first index corresponding to an actual value of the data sample quantized to the dictionary and assigned an index value in a sorted order according to the sorted order of the actual values;
using for each of the different classes a different dictionary for selecting the first index;
generating a predicted value of the data sample in response to previously received data samples in the data stream and to a prediction algorithm, wherein the prediction algorithm is selected in response to the class of the data sample and the value is constructed based on a class based unique value dictionary;
selecting a second index of the predicted value in the dictionary such that the second index is an index value that corresponds to an actual value in the sorted order of the actual values in the dictionary that is closest to a quantization of the predicted value;
calculating a difference between the first index and the second index as a quantized label difference;
compressing the difference between the first index and the second index; and
outputting the compressed difference between the first index and the second index.

2. The method of claim 1, wherein an actual value in the dictionary that is closest to the predicted value is the actual value in the dictionary that has a minimum absolute difference with respect to the predicted value.

3. The method of claim 1, further comprising constructing the dictionary in response to the data stream.

4. The method of claim 3, further comprising compressing the dictionary and outputting the compressed dictionary.

5. The method of claim 3, further comprising outputting a meta-data value indicating the prediction algorithm used.

6. The method of claim 3, wherein the outputting comprises storing the compressed difference between the first index and the second index.

7. The method of claim 3, wherein the outputting comprises transmitting the compressed difference between the first index and second index over a network having a plurality of devices in processing communication with one another.

8. The method of claim 1, wherein the data stream comprises seismic data.

9. The method of claim 1, wherein the different classes are based on spatial regions in a raw seismic data shot.

10. The method of claim 1, wherein the different classes are based on the data samples having a common exponent value.

11. A system comprising:
an encoder comprising a processor and memory configured for:
receiving a data stream comprising data samples, each of the data samples having one of a plurality of actual values wherein the encoder is further configured for constructing a dictionary in response to the data stream; and
performing for each of the data samples:
selecting a first index in the dictionary, the dictionary comprising indices corresponding to each of the plurality of actual values in a sorted order of the actual values wherein the data samples in the data stream are classified into a plurality of different classes and the first index is based upon the classification, the first index corresponding to an actual value of the data sample quantized to the dictionary and assigned an index value in a sorted order according to the sorted order of the actual values
generating a predicted value of the data sample in response to previously received data samples in the data stream and to a prediction algorithm;
selecting a second index of the predicted value in the dictionary, the second index is an index value corresponding to an actual value in the sorted order of the actual values in the dictionary that is closest to a quantization of the predicted value;
calculating a difference between the first index and the second index as a quantized label difference;
compressing the difference between the first index and the second index; and
outputting the compressed difference between the first index and the second index.

12. The system of claim 11, wherein an actual value in the dictionary that is closest to the predicted value is the actual value in the dictionary that has a minimum absolute different with respect to the predicted value.

13. The system of claim 12, wherein the encoder is further configured for compressing the dictionary and outputting the compressed dictionary.

14. The system of claim 13, wherein the encoder is further configured for outputting a meta-data value indicating the prediction algorithm used.

15. The system of claim 14, wherein each of the different classes utilizes a different dictionary for selecting a first index and a second index.

16. A method comprising:
receiving a data stream comprising a plurality of compressed index difference values representing a plurality of data samples; and
performing for each compressed index difference value received in the data stream:
decompressing the compressed index difference value resulting in an index difference value of quantized label differences wherein the data samples in the data stream are classified into a plurality of different classes;
generating a predicted value of a data sample in response to previously received compressed index difference values and to a prediction algorithm;
selecting a second index of the predicted value in a dictionary, the dictionary comprising indices corresponding to each of a plurality actual values of data samples in a sorted order of the actual values, the second index is an index value corresponding to an actual value in the sorted order of the actual values in the dictionary that is closest to a quantization of the predicted value of the data sample;
identifying a first index in the dictionary corresponding to an actual value of a data sample quantized to the dictionary and assigned an index value in a sorted order according to the sorted order of the actual values and represented by the received compressed index difference value, the identifying responsive to the second index, the index difference value, and the dictionary; and
outputting the actual value of the data sample.

17. The method of claim 16, further comprising receiving the dictionary from an encoder.

18. The method of claim 16, further comprising receiving meta-data identifying the prediction algorithm.

19. The method of claim 16, wherein the receiving is from a storage medium.

20. The method of claim 16, wherein the receiving is via a network.

21. A system comprising:
a decoder comprising a processor and memory configured for:
receiving a data stream comprising a plurality of compressed index difference values representing a plurality of data samples wherein the data samples in the data stream are classified into a plurality of different classes; and
performing for each compressed index difference value received in the data stream:
decompressing the compressed index difference value resulting in an index difference value of quantized label differences;
generating a predicted value of a data sample in response to previously received compressed index difference values and to a prediction algorithm;
selecting a second index of the predicted value in a dictionary, the dictionary comprising indices corresponding to each of a plurality actual values of data samples in a sorted order of the actual values, the second index is an index value corresponding to an actual value in the sorted order of the actual values in the dictionary that is closest to a quantization of the predicted value of the data sample;
identifying a first index in the dictionary corresponding to an actual value of a data sample quantized to the dictionary and assigned an index value in a sorted order according to the sorted order of the actual values and represented by the received compressed index difference value, the identifying responsive to the second index, the index difference value, and the dictionary; and
outputting the actual value of the data sample.

22. The system of claim 21, wherein the decoder is further configured for receiving at least one of the dictionary and meta-data identifying the prediction algorithm.

23. The system of claim 21, wherein the receiving is from a storage medium.

24. The system of claim 21, wherein the receiving is via a network.

* * * * *